United States Patent
Nakatani

(10) Patent No.: US 8,927,321 B2
(45) Date of Patent: Jan. 6, 2015

(54) METHOD FOR PRODUCING SOLID-STATE IMAGING DEVICE

(71) Applicant: FUJIFILM Corporation, Tokyo (JP)

(72) Inventor: Toshihiro Nakatani, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/221,172

(22) Filed: Mar. 20, 2014

(65) Prior Publication Data

US 2014/0206128 A1 Jul. 24, 2014

Related U.S. Application Data

(63) Continuation of application No. PCT/JP2012/067795, filed on Jul. 12, 2012.

(30) Foreign Application Priority Data

Sep. 20, 2011 (JP) ................................. 2011-204946

(51) Int. Cl.
| | |
|---|---|
| *H01L 21/00* | (2006.01) |
| *H01L 51/00* | (2006.01) |
| *H01L 27/146* | (2006.01) |
| *H01L 27/30* | (2006.01) |

(52) U.S. Cl.
CPC ...... *H01L 27/14687* (2013.01); *H01L 51/0011* (2013.01); *H01L 27/305* (2013.01); *H01L 51/001* (2013.01)
USPC .............................................. 438/66; 438/82

(58) Field of Classification Search
CPC ............ H01L 27/305; H01L 27/14587; H01L 51/001; H01L 51/0011
USPC ...................................................... 438/66, 82
See application file for complete search history.

(56) References Cited

U.S. PATENT DOCUMENTS

| | | | |
|---|---|---|---|
| 6,689,491 | B1 | 2/2004 | Nii et al. |
| 6,921,591 | B2 | 7/2005 | Nii et al. |

(Continued)

FOREIGN PATENT DOCUMENTS

| | | |
|---|---|---|
| JP | 05-196044 A | 8/1993 |
| JP | 10-265940 A | 10/1998 |

(Continued)

OTHER PUBLICATIONS

International Search Report; PCT/JP2012/067795; Aug. 7, 2012.

(Continued)

*Primary Examiner* — Trung Q Dang
(74) *Attorney, Agent, or Firm* — Studebaker & Brackett PC

(57) ABSTRACT

The solid-state imaging device in which pixel electrodes, a photoelectric conversion portion having an organic film generating electric charge in response to incident light, a transparent counter electrode, and a sealing layer are formed on a substrate is produced by the method including causing a metal mask to come into close contact with a substrate surface, on which the pixel electrodes are disposed, by magnetic force; forming the organic film by vapor-depositing an organic substance to the substrate surface on which the pixel electrodes are disposed; removing the metal mask after the organic film is formed; forming the counter electrode on the organic film; and forming the sealing layer covering the counter electrode, wherein the metal mask has undergone half etching to have a half etching portion and comes into close contact with the substrate surface such that a lower surface of the half etching portion faces the pixel electrodes.

16 Claims, 8 Drawing Sheets

(56) References Cited

U.S. PATENT DOCUMENTS

| | | |
|---|---|---|
| 8,368,058 B2 | 2/2013 | Sawaki et al. |
| 2005/0065351 A1 | 3/2005 | Nii et al. |
| 2010/0194941 A1* | 8/2010 | Maehara et al. ............. 348/281 |
| 2011/0298023 A1* | 12/2011 | Ohguro ........................ 257/291 |
| 2012/0161270 A1* | 6/2012 | Maehara et al. ............. 257/432 |
| 2012/0326257 A1* | 12/2012 | Takata ......................... 257/432 |

FOREIGN PATENT DOCUMENTS

| | | |
|---|---|---|
| JP | 2004-055231 A | 2/2004 |
| JP | 2007-273854 A | 10/2007 |
| JP | 4213832 B2 | 11/2008 |
| JP | 2010-271445 A | 12/2010 |
| JP | 2011-071469 A | 4/2011 |
| JP | 2011-216728 A | 10/2011 |

OTHER PUBLICATIONS

An Office Action; "Notification of Reasons for Refusal," issued by the Japanese Patent Office on May 7, 2014, which corresponds to Japanese Patent Application No. 2011-204946 and is related to U.S. Appl. No. 14/221,172; with English language partial translation.

* cited by examiner

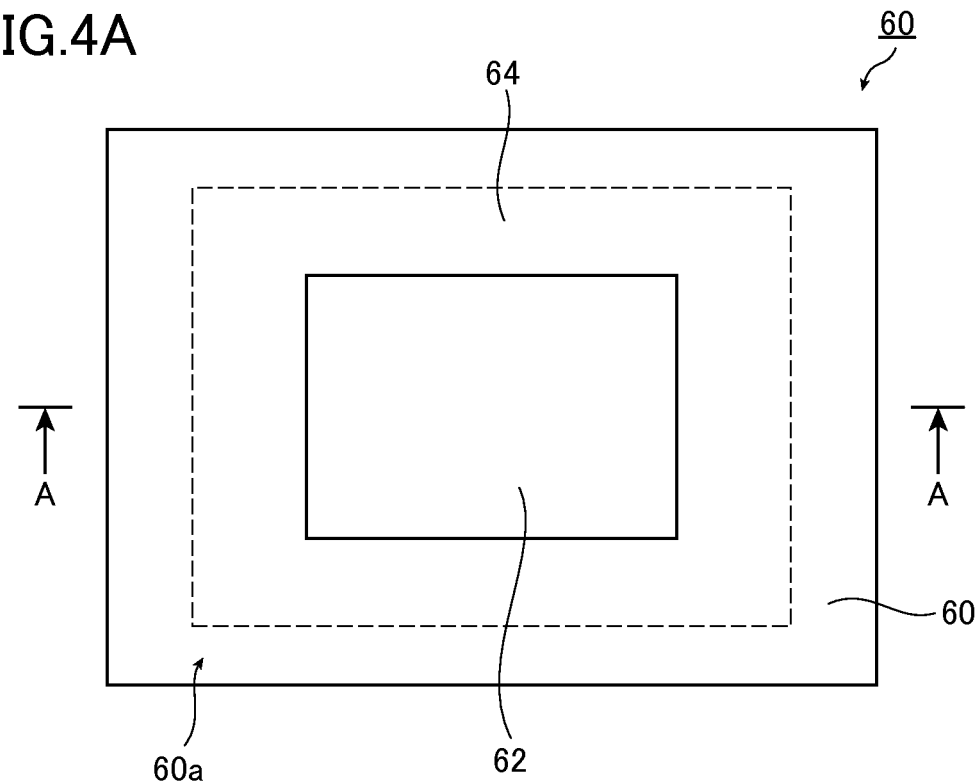
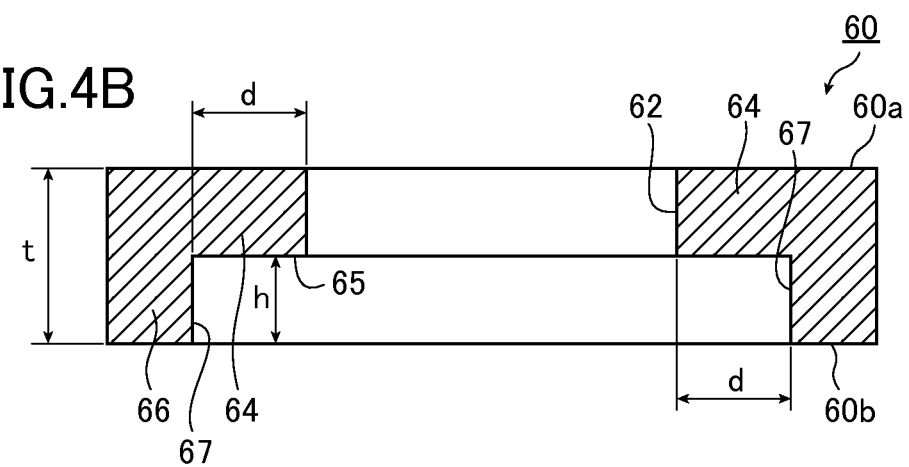

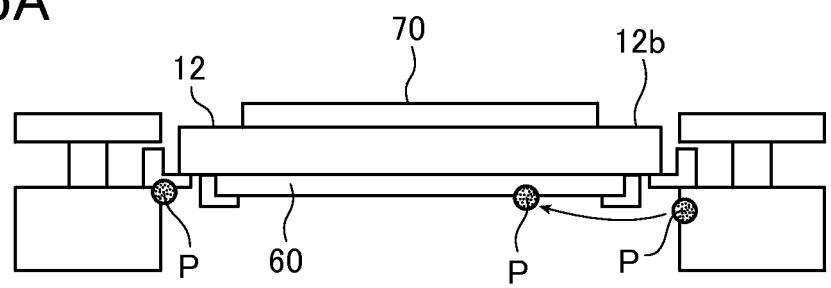
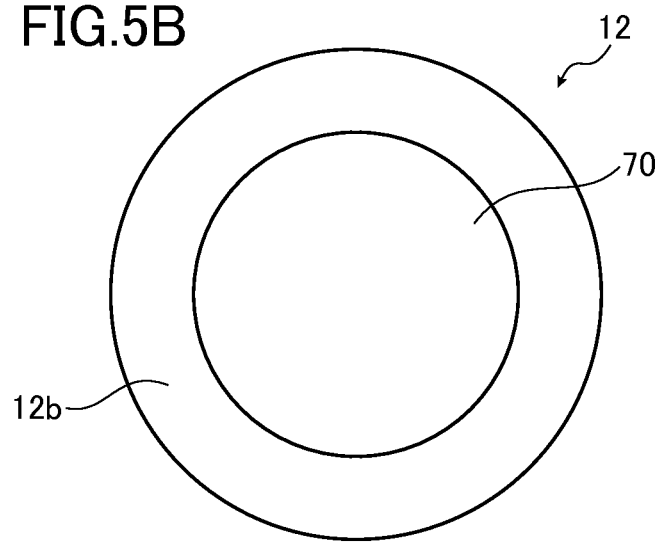

VAPOR-DEPOSITION OF ORGANIC MATERIAL

METHOD FOR PRODUCING SOLID-STATE IMAGING DEVICE

CROSS REFERENCE TO RELATED APPLICATIONS

This application is a continuation application of International Application PCT/JP2012/067795 filed on Jul. 12, 2012, which claims priority under 35 U.S.C. 119(a) to Application No. 2011-204946 filed in Japan on Sep. 20, 2011, all of which are hereby expressly incorporated by reference into the present application.

BACKGROUND OF THE INVENTION

The present invention relates to a method for producing a solid-state imaging device having a photoelectric conversion portion including an organic film that generates electric charge in response to incident light. Particularly, the present invention relates to a method for producing a solid-state imaging device that can increase yield of the device.

As image sensors used for digital still cameras, digital video cameras, cameras for cellular phones, cameras for endoscopes, and the like, solid-state imaging devices (so-called CCD sensors and CMOS sensors), in which pixels having photodiodes are arranged on a semiconductor substrate such as a silicon (Si) chip, and signal electric charge corresponding to photoelectrons generated by the photodiode of each pixel is obtained by a CCD-type or CMOS-type readout circuit, are widely known.

In each pixel on the semiconductor substrate of these solid-state imaging devices, not only the photodiode but also a signal readout circuit and multilayer wiring subsidiary to the circuit are formed. Accordingly, as progress of pixel microfabrication is accelerated, the "decrease in aperture ratio," as a phenomenon in which the readout circuit/wiring take up a relatively wide area and reduce a light-receiving area of the photodiode in one pixel, has become a problem. The decrease in aperture ratio leads to decrease in sensitivity.

Regarding the aforementioned problem, a laminate-type solid-state imaging device, which can increase the aperture ratio by forming a photoelectric conversion layer on top of a semiconductor substrate on which a readout circuit and wiring have been formed, is known. The laminate-type solid-state imaging device has configuration in which a large number of photoelectric conversion elements, which include pixel electrodes formed on a semiconductor substrate, a photoelectric conversion layer formed on the pixel electrodes, and a counter electrode formed on the photoelectric conversion layer, are arranged on a surface that is in parallel with the semiconductor substrate. In the photoelectric conversion element, when bias voltage is applied between the pixel electrodes and the counter electrode, an exciton generated inside the photoelectric conversion layer is dissociated into an electron and a hole, and a signal corresponding to the electric charge of the electron or hole that has moved to the pixel electrodes according to the bias voltage is obtained by a CCD-type or CMOS-type readout circuit disposed inside the semiconductor substrate.

In the laminate-type solid-state imaging device, pixel electrodes and an organic film which is formed by vapor-deposition of an organic material and functions as a photoelectric conversion layer are formed in the order mentioned on a semiconductor substrate in which a readout circuit has been formed. On the organic film, a counter electrode formed of a transparent electrode, such as ITO film, is formed. Moreover, a sealing film, a color filter, and the like are sequentially laminated on the counter electrode to produce the solid-state imaging device.

For example, as disclosed in JP 10-265940 A, the ITO film is formed by using a metal mask. Usually, the metal mask is fixed to a substrate by using a magnet. Therefore, the metal mask is formed by etching a plate made of a magnetic material.

SUMMARY OF THE INVENTION

Incidentally, during the process of producing a solid-state imaging device, fine magnetic particles formed of iron or other metals adhere to the surface of the organic film (photoelectric conversion layer) in some cases. When a sealing film is formed on the surface of the organic film in the state where the particles have adhered to the surface, an organic solvent or the like which is used in the subsequent steps intrudes into the organic film by utilizing the particles as a starting point, and in some cases, this leads to a phenomenon that is so-called film blistering in which the organic film is locally blistered. When the film blistering is caused, a problem that the yield of the solid-state imaging device becomes poor arises.

An object of the present invention is to solve the aforementioned problems that the conventional technique has and to provide a method for producing a solid-state imaging device that can increase the yield.

In order to attain the above-described object, the present invention provides a method for producing a solid-state imaging device in which pixel electrodes, a photoelectric conversion portion that has an organic film generating electric charge in response to incident light, a transparent counter electrode, and a sealing layer are formed on a substrate, the method comprising the steps of: causing a metal mask to come into close contact with a substrate surface, on which the pixel electrodes are disposed, by magnetic force; forming the organic film by vapor-depositing an organic substance to the substrate surface on which the pixel electrodes are disposed; removing the metal mask after the organic film is formed; forming the counter electrode on the organic film; and forming the sealing layer covering the counter electrode, wherein the metal mask has undergone half etching to have a half etching portion and comes into close contact with the substrate surface such that a lower surface of the half etching portion faces the pixel electrodes.

Preferably, a thickness of the metal mask is 40 μm to 200 μm, and the half etching portion is formed by half etching the metal mask in a length of 20 μm to 1,200 μm and to a depth of from 5 μm to a value equal to or less than half of the thickness of the metal mask.

Preferably, the substrate and the metal mask are held and transported by a mechanism fully made of a nonmagnetic material.

For example, the metal mask is caused to come into close contact with the substrate surface by a magnet sheet.

Furthermore, as another example, the metal mask is caused to come into close contact with the substrate surface by a flat plate paved with magnets.

In this example, by adjusting a distance between the flat plate paved with magnets and the metal mask, magnetic force applied to the metal mask can be adjusted to a predetermined level.

Preferably, the magnetic force applied to the metal mask is adjusted so as to be equivalent to magnetic force obtained when a magnet sheet is used.

According to the present invention, it is possible to inhibit the adherence of so-called dust such as fine magnetic particles or fine non-magnetic particles and to increase the yield of a solid-state imaging device.

BRIEF DESCRIPTION OF THE DRAWINGS

FIG. 4A is a plan view showing a metal mask used for producing the solid-state imaging device according to an embodiment of the present invention. FIG. 4B is a cross-sectional view taken along the line A-A of FIG. 4A.

FIG. 5A is a schematic view showing in detail the step shown in FIG. 2B. FIG. 5B is a schematic view showing an example of method of mounting the metal mask.

DETAILED DESCRIPTION OF THE INVENTION

Hereinafter, based on preferable embodiments shown in the attached drawings, the method for producing a solid-state imaging device of the present invention will be described in detail.

Figure 1:
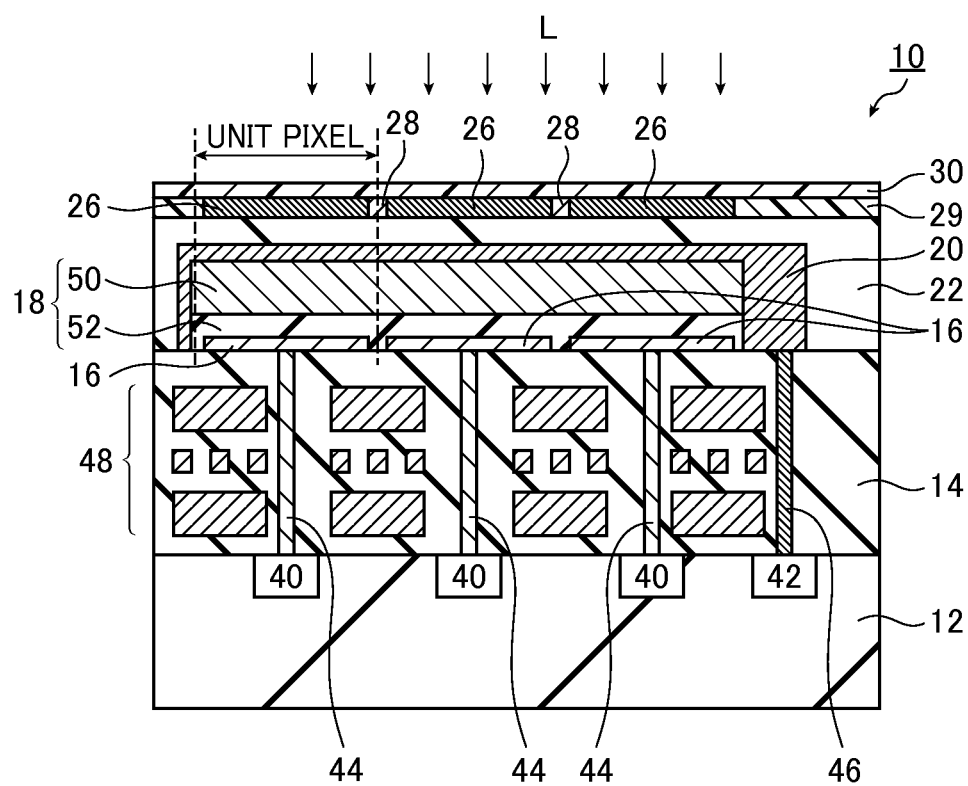
FIG. 1 is a schematic cross-sectional view showing a solid-state imaging device according to an embodiment of the present invention.

FIG. 1 is a schematic cross-sectional view showing a solid-state imaging device according to an embodiment of the present invention.

The imaging device according to the embodiment of the present invention can be used in imaging apparatuses such as digital cameras and digital video cameras. Moreover, the imaging device is used by being mounted on imaging modules and the like of electronic endoscopes, cellular phones, and the like.

A solid-state imaging device 10 shown in FIG. 1 has a substrate 12, an insulating layer 14, pixel electrodes 16, a photoelectric conversion portion 18, a counter electrode 20, a sealing layer (protective film) 22, color filters 26, partitions 28, light-shielding layer 29, and a protective layer 30.

In the substrate 12, readout circuits 40 and a voltage supply portion 42 supplying voltage to the counter electrode are formed.

As the substrate 12, for example, a glass substrate or a semiconductor substrate such as Si is used. On the substrate 12, the insulating layer 14 formed of a known insulating material is formed. On the surface of the insulating layer 14, plural pixel electrodes 16 are formed. The pixel electrodes 16 are arranged by, for example, a one-dimensional manner or a two-dimensional manner.

Moreover, in the insulating layer 14, first connection portions 44 that connect the pixel electrodes 16 to the readout circuits 40 and a second connection portion 46 that connects the counter electrode 20 to the voltage supply portion 42 supplying voltage to the counter electrode are formed. The second connection portion 46 is formed in a position where it is not connected to the pixel electrodes 16 and the photoelectric conversion portion 18. The first connection portions 44 and the second connection portion 46 are formed of a conductive material.

In the inside of the insulating layer 14, a wiring layer 48, which is for connecting the readout circuits 40 and the voltage supply portion 42 to, for example, the outside of the solid-state imaging device 10 and is formed of a conductive material, is formed.

The photoelectric conversion portion 18 is formed so as to cover the plural pixel electrodes 16 while avoiding the second connection portion 46. The photoelectric conversion portion 18 has a photoelectric conversion layer 50, which contains an organic substance, and an electron blocking layer 52.

In the photoelectric conversion portion 18, the electron blocking layer 52 is formed at the side of the pixel electrodes 16, and the photoelectric conversion layer 50 is formed on the electron blocking layer 52. The electron blocking layer 52 has a function of suppressing dark currents.

The photoelectric conversion layer 50 generates electric charge corresponding to the amount of received light such as incident light L and contains an organic photoelectric conversion material.

The counter electrode 20 is opposed to the pixel electrodes 16 and is disposed to cover the photoelectric conversion layer 50. The photoelectric conversion layer 50 is disposed between the pixel electrodes 16 and the counter electrode 20.

The counter electrode 20 is configured with a conductive material exhibiting transparency with respect to the incident light so as to allow the light to enter the photoelectric conversion layer 50. The counter electrode 20 is electrically connected to the second connection portion 46 which is disposed outside the photoelectric conversion layer 50 and is connected to the voltage supply portion 42 supplying voltage to the counter electrode through the second connection portion 46.

As a material of the counter electrode 20, any of materials including ITO, IZO, $SnO_2$, antimony-doped tin oxide (ATO), ZnO, Al-doped zinc oxide (AZO), gallium-doped zinc oxide (GZO), $TiO_2$, and fluorine-doped tin oxide (FTO) is preferable.

The light transmittance of the counter electrode 20 is preferably 60% or higher, more preferably 80% or higher, even more preferably 90% or higher, and still more preferably 95% or higher in the visible ray wavelength region.

The voltage supply portion 42 supplying voltage to the counter electrode applies predetermined voltage to the counter electrode 20 through the second connection portion 46. When the voltage which should be applied to the counter electrode 20 is higher than the power supply voltage of the solid-state imaging device 10, the voltage supply portion 42 supplies the predetermined voltage by increasing the power supply voltage by using a boosting circuit such as a charge pump.

The pixel electrodes 16 are electric charge-collecting electrodes that are for collecting electric charge generated in the photoelectric conversion layer 50 placed between the pixel electrodes 16 and the counter electrode 20 opposed to the pixel electrodes 16. The pixel electrodes 16 are connected to the readout circuits 40 through the first connection portions 44. The readout circuit 40 is disposed on the substrate 12 in association with each of the plural pixel electrodes 16 and readouts the signal corresponding to the electric charge collected by the pixel electrode 16 that is in association with the readout circuit 40. The electric charge collected by each pixel electrode 16 is converted into a signal in the readout circuit 40 that is in association with each pixel. From signals obtained from plural pixels, an image is synthesized.

Examples of the material of the pixel electrodes 16 include metals, metal oxides, metal nitrides, metal borides, organic conductive compounds, mixtures of these, and the like. Specific examples thereof include conductive metal oxides such as tin oxide, zinc oxide, indium oxide, indium tin oxide (ITO), indium zinc oxide (IZO), indium tungsten oxide (IWO), and titanium oxide; metal nitrides such as titanium nitride (TiN); metals such as gold (Au), platinum (Pt), silver (Ag), chromium (Cr), nickel (Ni), and aluminum (Al); mixtures or laminates consisting of these metals and conductive metal oxides; organic conductive compounds such as polyaniline, polythiophene, and polypyrrole; laminates consisting of these organic conductive compounds and ITO; and the like. As a material of the pixel electrodes 16, any of titanium nitride, molybdenum nitride, tantalum nitride, and tungsten nitride is particularly preferable.

If a step difference corresponding to the film thickness of the pixel electrode 16 is steep at the edge of the pixel electrode 16, if there are marked concavities and convexities on the surface of the pixel electrode 16, or if fine dust adheres to the surface of the pixel electrode 16, the thickness of the photoelectric conversion layer 50 or the electron blocking layer 52 over the pixel electrodes 16 becomes smaller than a desired film thickness or cracks occur in the layer. If the counter electrode 20 is formed on the layers in such a state, due to the contact between the pixel electrodes 16 and the counter electrode 20 or concentration of electric field in the defective portion, pixel defectiveness such as increase in dark currents, a short circuit, or the like is caused. Moreover, the aforementioned defectiveness may deteriorate adhesiveness between the pixel electrodes 16 and the layer over these electrodes and heat resistance of the solid-state imaging device 10.

In order to prevent the aforementioned defectiveness and improve reliability of the device, it is preferable to control a surface roughness Ra of the pixel electrodes 16 to be 0.6 nm or lower. The lower the surface roughness Ra of the pixel electrodes 16 is, the smaller the concavities and convexities on the surface thereof becomes, and accordingly, the surface flatness becomes excellent. Basically, it is preferable for the step difference corresponding to the film thickness of the pixel electrode 16 to be zero. In this case, the pixel electrodes 16 can be buried in the insulating layer 14, and then a chemical mechanical polishing (CMP) process or the like can be performed to form the pixel electrodes 16 without a step difference. Furthermore, by causing the edge of the pixel electrodes 16 to slope, the degree of step difference can be mitigated. By selecting conditions of an etching process of the pixel electrodes 16, the slope can be formed. In order to remove particles on the pixel electrodes 16, it is particularly preferable to wash the pixel electrodes 16 and the like before the electron blocking layer 52 is formed, by general washing technique that is used in the semiconductor production process.

The readout circuit 40 is configured with, for example, a CCD, MOS, or TFT circuit, and is shielded from light by a light-shielding layer (not shown in the drawing) disposed inside the insulating layer 14. For the readout circuit 40, it is preferable to adopt a CCD or CMOS circuit if the solid-state imaging device is used as a general image sensor. From the viewpoints of noise properties and high-speed performance, it is preferable to adopt a CMOS circuit.

Moreover, though not shown in the drawing, for example, a p-region of a high concentration that is surrounded by an n-region is formed in the substrate 12. The p-region is connected to the first connection portions 44, and the readout circuits 40 are disposed in the n-region. The p-region functions as an electric charge accumulating portion in which the electric charge of the photoelectric conversion layer 50 is accumulated. By the readout circuits 40, the electrons or holes accumulated in the p-region are converted into signals corresponding to the amount of the electric charge, and output to the outside of the solid-state imaging device 10 through, for example, the wiring layer 48.

The sealing layer 22 is for protecting the photoelectric conversion layer 50 containing an organic substance from factors causing deterioration such as water molecules. The sealing layer 22 is formed to cover the counter electrode 20.

The sealing layer 22 is required to satisfy the following conditions.

First, in each step of producing the device, the sealing layer 22 needs to hinder the intrusion of factors which are contained in solutions, plasma, and the like and deteriorate organic photoelectric conversion materials so as to protect the photoelectric conversion layer.

Second, after the device is produced, the sealing layer 22 needs to hinder the intrusion of factors such as water molecules which deteriorate organic photoelectric conversion materials so as to prevent the photoelectric conversion layer 50 from deteriorating over a long period time during which the device is stored and used.

Third, at the time when the sealing layer 22 is formed, the sealing layer 22 needs not to deteriorate the photoelectric conversion layer that has already been formed.

Fourth, since the incident light reaches the photoelectric conversion layer 50 through the sealing layer 22, the sealing layer 22 should be transparent to the light of a wavelength that is detected by the photoelectric conversion layer 50.

The sealing layer 22 can be constituted with a thin film formed of a single material. However, if this layer has a multi-layer structure, and each of the layers is caused to function in different ways, it is possible to expect effects such as stress relaxation of the entire sealing layer 22, inhibition of occurrence of defectiveness such as cracks or pin holes caused by dust or the like rising during the production process, and ease of optimization of material development. For example, the sealing layer 22 can be constituted with two layers including a layer, which plays its original role of preventing intrusion of factors such as water molecules causing deterioration, and an "auxiliary sealing layer" which is laminated on the above layer and has a function that is not easily obtained from the above layer. The sealing layer 22 can be constituted with three or more layers. However, in respect of production costs, the smaller the number of the layers, the better.

For example, the sealing layer 22 can be formed by the following manner.

The performance of organic photoelectric conversion materials remarkably deteriorates due to factors such as water molecules causing the deterioration. Accordingly, the entire photoelectric conversion layer needs to be sealed by being covered with a dense metal oxide film, metal nitride film, metal oxynitride film, or the like that does not allow permeation of water molecules. Conventionally, aluminum oxide, silicon oxide, silicon nitride, silicon oxynitride, a laminate structure of these, a laminate structure constituted with these and an organic polymer, and the like are formed into a sealing layer by various vacuum film formation techniques.

An atomic layer deposition (ALD) method is sort of a CVD method, and is a technique of forming a thin film by alternately repeating a reaction caused by adsorption of organic metal compound molecules, metal halide molecules, and metal hydride molecules, which are thin film materials, onto the substrate surface, and decomposition of unreacted groups contained in the above materials. When reaching the substrate surface, the thin film material is in the state of small molecules, and accordingly, a thin film can grow as long as there is an extremely small space into which the small molecules can penetrate. Consequently, the portion of step difference can be completely covered (the thickness of the thin film having grown in the portion of step difference becomes the same as the thickness of the thin film having grown in the flat portion), unlike in the conventional thin film formation method having difficulties in doing this. That is, the atomic layer deposition (ALD) method is extremely excellent in step difference covering properties. Therefore, since step differences due to structures on the substrate surface, minute defectiveness on the support surface, particles adhering onto the substrate surface, and the like can be completely covered, the aforementioned portion of step difference does not become a route through which factors causing deterioration of the photoelectric conversion material intrude. When the sealing layer 22 is formed by the atomic layer deposition (ALD) method, it is possible to more effectively reduce the film thickness of the sealing layer compared to the conventional technique.

When the sealing layer 22 is formed by the atomic layer deposition method, the above materials preferable for the sealing layer 22 can be appropriately selected. However, the materials are limited to materials which may not deteriorate the organic photoelectric conversion material and can grow into a thin film at a relatively low temperature. If alkyl aluminum or aluminum halide is used for the atomic layer deposition method, it is possible to form a dense aluminum oxide thin film at a temperature of lower than 200° C. at which the organic photoelectric conversion material does not deteriorate. Particularly, use of trimethyl aluminum is preferable since this makes it possible to form an aluminum oxide thin film even at a temperature of about 100° C. Silicon oxide or titanium oxide is also preferable since this makes it possible to form a dense thin film as the sealing layer 22 at a temperature of lower than 200° C. similarly to aluminum oxide by appropriately selecting materials.

If the thin film is formed by the atomic layer deposition method, a thin film with excellent quality that is unsurpassed in view of step difference covering properties and density can be formed at a low temperature. However, the thin film deteriorates in some cases due to chemicals used in a photolithography process. For example, an aluminum oxide thin film formed by the atomic layer deposition method is amorphous, hence the surface thereof is corroded by an alkaline solution such as a developer or stripper. In this case, a thin film having excellent chemical resistance needs to be disposed on the aluminum oxide thin film formed by the atomic layer deposition film method. That is, an auxiliary sealing layer as a functional film protecting the sealing layer 22 is necessary.

Meanwhile, in many cases, the thin film formed by the atomic layer deposition method has tensile stress by which the internal stress thereof becomes extremely high. Accordingly, due to the process in which heating and cooling are intermittently repeated, such as a semiconductor production process, or due to the long-term storage and use of the thin film in a high-temperature and high-humidity atmosphere, deterioration of the thin film occurs in some cases by cracking of the thin film.

In order to overcome the aforementioned problem of the sealing layer 22 formed by the atomic layer deposition method, for example, it is preferable to adopt a configuration in which a stress relaxation layer 24 is disposed as an auxiliary sealing layer which is formed into a film by a physical vapour deposition (PVD) method such as a sputtering method or by a CVD method and contains any one of the inorganic materials such as metal oxides, metal nitrides, and metal nitride oxides that are excellent in chemical resistance.

In the present embodiment, a layer formed by the atomic layer deposition method is disposed as a first sealing layer (sealing layer 22), and on the first sealing layer (sealing layer 22), a layer which is formed by the PVD method and contains any one of the inorganic materials including metal oxides, metal nitrides, and metal nitride oxides is disposed as a second sealing layer. As a result, the chemical resistance of the entire sealing layer 22 can be easily improved. Moreover, when being formed by the PVD method such as a sputtering method, the film has great compressive stress in many cases, hence the tensile stress of the first sealing layer formed by the atomic layer deposition method can be cancelled out. Accordingly, the stress of the entire sealing layer 22 is released, and the reliability of the sealing layer 22 is improved. In addition, it is possible to remarkably suppress the occurrence of defectiveness such as performance deterioration or destruction of the photoelectric conversion layer and the like that is caused by the stress of the sealing layer 22.

Particularly, it is preferable to employ a configuration in which a second sealing layer, which is formed by a sputtering method and contains any one of aluminum oxide, silicon oxide, silicon nitride, and silicon oxynitride, is placed on the first sealing layer (sealing layer 22). Moreover, the film thickness of the sealing layer 22 (first sealing layer) is preferably from 0.05 μm to 0.2 μm. Furthermore, it is preferable for the sealing layer 22 (first sealing layer) to contain any one of an aluminum oxide, silicon oxide, and titanium oxide.

The color filter 26 is formed in the position opposed to each of the pixel electrodes 16 on the sealing layer 22. The partition 28 is disposed between the color filters 26 on the sealing layer 22, and is for improving light transmission efficiency of the color filters 26. The light shielding layer 29 is formed on the sealing layer 22, in a position not included in the area where there are the color filters 26 and the partitions 28 (area of effective pixels). The light shielding layer 29 prevents light from entering the photoelectric conversion layer 50 formed in a position not included in the area of effective pixels.

The protective layer 30 is for protecting the color filters 26 during the subsequent processes and the like, and is formed to cover the color filters 26, partitions 28, and the light shielding layer 29. The protective layer 30 is also called an over coat layer.

In the solid-state imaging device 10, one pixel electrode 16 on which the photoelectric conversion portion 18, the counter electrode 20, and the color filter 26 are formed is a unit pixel.

For the protective layer 30, polymer materials such as acrylic resins, polysiloxane-based resins, polystyrene-based resins, or fluororesins and inorganic materials such as silicon oxide or silicon nitride can be used appropriately. If photosensitive resins such as polystyrene-based resins are used, the protective layer 30 can be subjected to patterning by a photolithography method. Therefore, this is preferable since it makes it easy to use such resins as a photoresist when the light shielding layer, the sealing layer, the insulating layer, and the like on a bonding pad are opened, and to process the protective layer 30 itself into a microlens. Meanwhile, the protective layer 30 can be used as an antireflection layer, and it is preferable to form various low-refractive index materials used as the partitions 28 of the color filters 26 into a film. Moreover, in order to obtain the function of the protective layer during the subsequent processes and the function of the antireflection layer, the protective layer 30 can be constituted with two or more layers composed of a combination of the above materials.

In the present embodiment, the pixel electrodes 16 are formed on the surface of the insulating layer 14. However, the present invention is not limited thereto, and the pixel electrodes 16 may be buried beneath the surface of the insulating layer 14. In addition, the imaging device has a single second connection portion 46 and a single voltage supply portion 42, but the imaging device may have a plurality of these portions. For example, if voltage is supplied to the counter electrode 20 from both ends of the counter electrode 20, it is possible to suppress a voltage drop of the counter electrode 20. The number of a set of the second connection portion 46 and the voltage supply portion 42 may be appropriately increased or decreased, in consideration of a chip area of the device.

Next, the method for producing the solid-state imaging device 10 according to an embodiment of the present invention will be described.

Figure 2A:
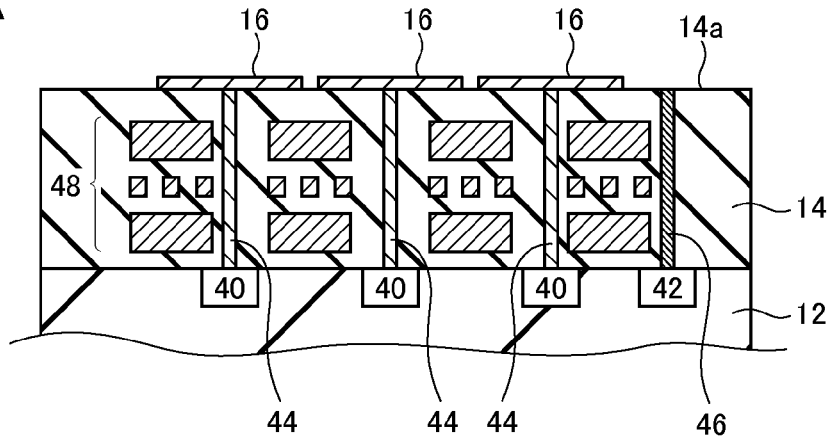
FIGS. 2A to 2C are schematic cross-sectional views showing a method for producing a solid-state imaging device according to an embodiment of the present invention in the sequence of steps.
Figure 2B:
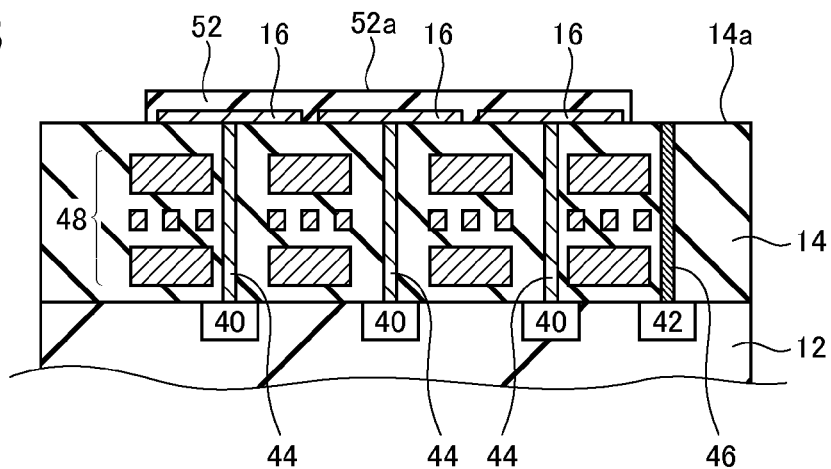
Figure 2C:
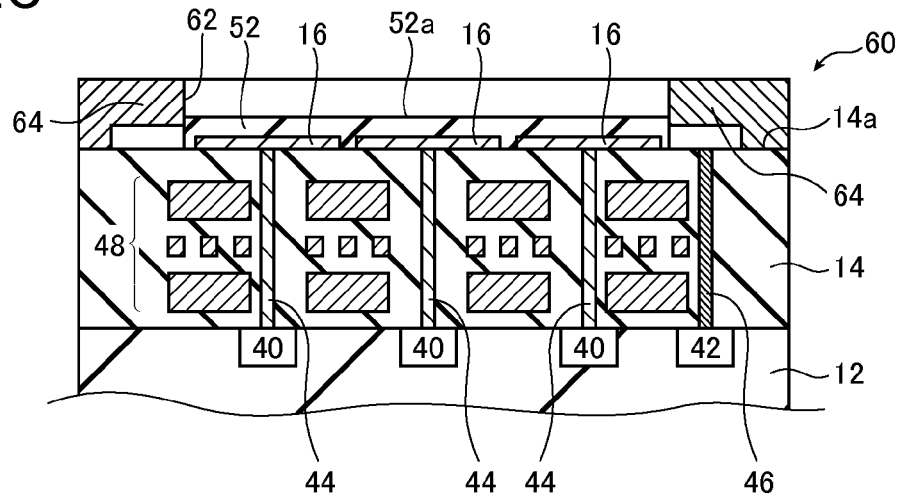
Figure 3A:
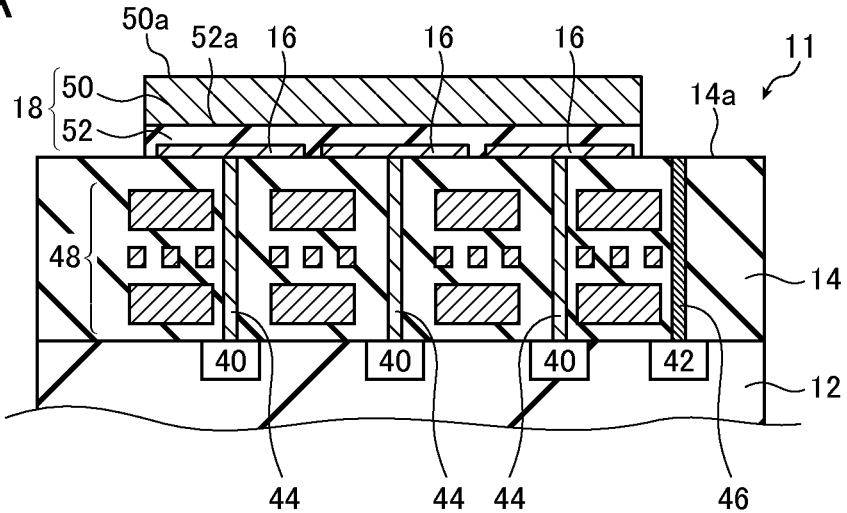
FIGS. 3A to 3C are schematic cross-sectional views showing the method for producing a solid-state imaging device according to an embodiment of the present invention in the sequence of steps. These views show steps following FIG. 2C.
Figure 3B:
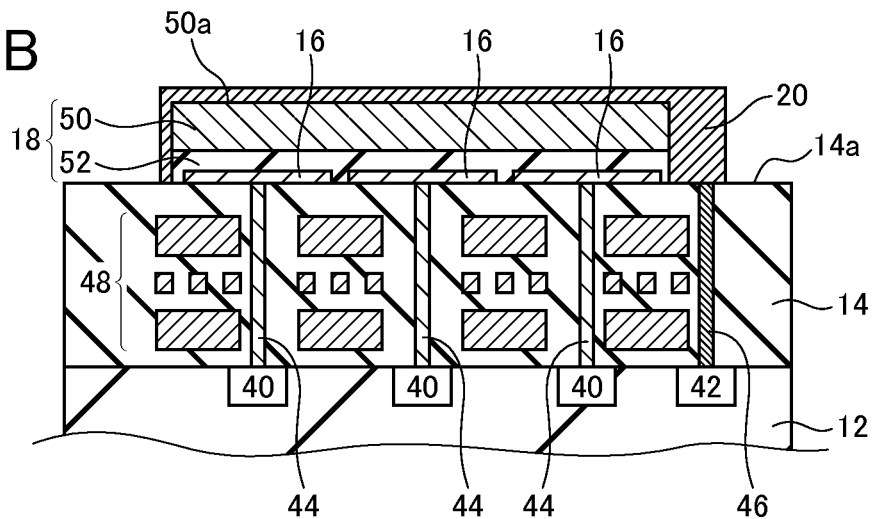
Figure 3C:
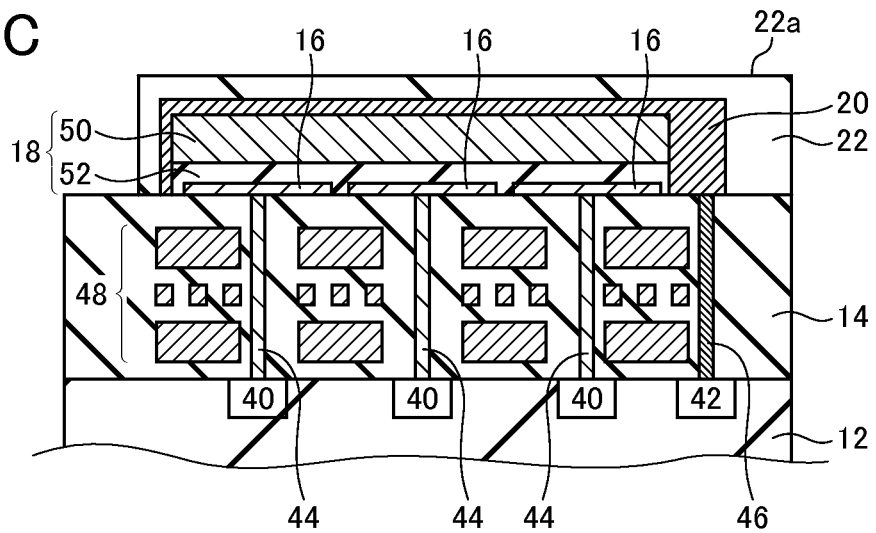

FIGS. 2A to 2C are schematic cross-sectional views showing a method for producing a solid-state imaging device according to an embodiment of the present invention in the sequence of steps. FIGS. 3A to 3C are schematic cross-sectional views showing the method for producing a solid-state imaging device according to an embodiment of the present invention in the sequence of steps, and these views show steps following FIG. 2C.

In the description of the method for producing the solid-state imaging device 10 according to the embodiment of the present invention, the solid-state imaging device 10 having a configuration in which three pixel electrodes 16 line up will be described as an example. However, plural solid-state imaging devices 10 in which, for example, the three pixel electrodes 16 make up a set are formed in the substrate 12, though this configuration is not shown in the drawing.

In the method for producing the solid-state imaging device 10 according to an embodiment of the present invention, first, a material in which the readout circuits 40 and the voltage supply portion 42 supplying voltage to the counter electrode 20 have been formed on the substrate 12, and formed thereon is the insulating layer 14 provided with the first connection portions 44, the second connection portion 46, and the wiring layer 48 is prepared. In this case, as described above, the first connection portions 44 are connected to the readout circuits 40, and the second connection portion 46 is connected to the voltage supply portion 42.

Thereafter, the material prepared is transported to a film formation chamber (not shown in the drawing) by predetermined transport means, and as shown in FIG. 2A, the pixel electrodes 16 connected to the respective first connection portions 44 are formed on a surface 14a of the insulating layer 14 by, for example, vapor-depositing a material for the pixel electrodes 16 onto the surface 14a by means of a CVD method in a vacuum of a predetermined degree, and then, subjecting the resultant to patterning. As the material of the pixel electrodes, for example, titanium nitride is used.

Then, the resultant is transported to a film formation chamber (not shown in the drawing) for forming the electron blocking layer 52 by predetermined transport means, and as shown in FIG. 2B, the electron blocking layer 52 is formed through a metal mask such that the electron blocking layer 52 covers the entire pixel electrodes 16 but not the top of the second connection portion 46. Regarding the metal mask, as shown in FIG. 2C, a metal mask 60, in which an opening portion 62 has been formed by using a predetermined mask pattern, is caused to come into close contact with the surface 14a of the insulating layer 14 by using magnetic force.

In the metal mask 60, the opening portion 62 is placed at the side of a surface 60a as shown in FIGS. 4A and 4B. The outer rim of the opening portion 62 is enlarged at the side of a rear surface 60b to form a half etching portion 64. The half etching portion 64 is a portion which has undergone half etching. In the metal mask 60, a portion not subjected to half etching is called a non-half etching portion 66.

The electron blocking material is formed into a film by, for example, vapor deposition method in a vacuum of a predetermined degree. After the electron blocking layer 52 is formed, the metal mask 60 is removed.

The rear surface 60b of the metal mask 60 is caused to come into close contact with the surface 14a of the insulating layer 14 by using, for example, a magnet sheet 70. At this time, the metal mask 60 is caused to come into close contact with the surface 14a, in the state where a lower surface 65 of the half etching portion 64 faces the pixel electrodes 16.

For example, as shown in FIG. 5A, the metal mask 60 is caused to come into close contact with the surface 14a (not shown in FIG. 5A) of the insulating layer 14 (not shown in FIG. 5A) of the substrate 12 by using the magnet sheet 70 disposed on a rear surface 12b of the substrate 12.

In the present embodiment, the magnet sheet 70 is used to cause the metal mask 60 to come into close contact with the substrate. The magnet sheet is used for the reasons that a uniform magnetic field can be formed on one surface at a low cost; it is easy to handle the magnet sheet since it will not have cracks; since the magnet sheet has relatively weak magnetic force, the impact exerted on the substrate when the metal mask is caused to come into close contact with the substrate can be suppressed as much as possible; and the like. The magnetic force can be indicated by an adsorption force, and the adsorption force is preferably from 10 g/cm$^2$ to 200 g/cm$^2$, more preferably from 15 g/cm$^2$ to 160 g/cm$^2$, and even more preferably from 20 g/cm$^2$ to 120 g/cm$^2$. Needless to say, the means for generating a magnetic field is not limited to the magnet sheet, and for example, a flat plate paved with magnets may be used.

In this case, by adjusting the distance between the flat plate paved with magnets and the metal mask, the magnetic force applied to the metal mask can be adjusted to a predetermined level. For example, it is possible to use the flat plate paved with magnets and the metal mask in a state where there is an appropriate interval therebetween, such that the thus obtained magnetic force becomes equivalent to that of the magnet sheet.

Subsequently, the resultant is transported to a film formation chamber (not shown in the drawing) for forming the photoelectric conversion layer 50 by predetermined transport means, and the photoelectric conversion layer 50 is formed through the metal mask similarly to the formation of the electron blocking layer. As the photoelectric conversion materials, for example, a p-type organic semiconductor material and fullerene or a fullerene derivative are deposited onto a surface 52a of the electron blocking layer 52 in a vacuum of a predetermined degree by using, for example, a vapor deposition method, whereby the photoelectric conversion layer 50 is formed as shown in FIG. 3A. In this manner, the photoelectric conversion layer 50 is formed to form the photoelectric conversion portion 18. After the photoelectric conversion layer 50 is formed, the metal mask 60 is removed.

Then, the resultant is transported to a film formation chamber (not shown in the drawing) for forming the counter electrode 20 by predetermined transport means. Thereafter, as shown in FIG. 3B, the counter electrode 20 is formed, for example, in a vacuum of a predetermined degree by using a sputtering method. The counter electrode 20 is formed in a pattern that covers the photoelectric conversion portion 18 and is formed on the second connection portion 46.

Thereafter, the resultant is transported to a film formation chamber (not shown in the drawing) for forming the sealing layer 22 by predetermined transport means, and as shown in FIG. 3C, the sealing layer 22 which covers the counter electrode 20 is formed on the surface 14a of the insulating layer 14.

Subsequently, on a surface 22a of the sealing layer 22, the color filters 26, the partitions 28, and the light-shielding layer 29 are formed by using, for example, a photolithography method. For the color filters 26, the partitions 28, and the light-shielding layer 29, known materials used in organic solid-state imaging devices are used. The step of forming the color filters 26, the partitions 28, and the light-shielding layer 29 may be performed in a vacuum of a predetermined degree or performed in a non-vacuum environment.

Then, the protective layer 30 which covers the color filters 26, the partitions 28, and the light-shielding layer 29 is formed by using, for example, a coating method. In this manner, the solid-state imaging device 10 shown in FIG. 1 can be formed. For the protective layer 30, any known material used in organic solid-state imaging devices is used. The step of forming the protective layer 30 may be performed in a vacuum of a predetermined degree or performed in a non-vacuum environment.

The metal mask is prepared through, for example, steps of preparing a frame, preparing a mask film, and bonding that are described below in detail.

(1) Preparing a frame: A thick stainless steel plate (having a thickness of about 20 mm) is hollowed out to prepared a frame.

(2) Preparing a mask film: First, the both sides of a film made of an invar material (Fe/Ni alloy) are coated with a photoresist. Then, the resultant is exposed to light and subjected to development by using an original mask that has been separately prepared, thereby forming pattern by the resist. Subsequently, the invar material is etched by an acid, the resist is peeled off and the invar material is washed. In this manner, a mask film is completed.

(3) Bonding: The film is pulled from all quarters such that it is stretched to a desired length, and the film is temporarily fixed. Then, the frame is fixed to the mask film by welding, and the surplus film extending out of the frame is cut. In this manner, the metal mask is prepared.

In some cases, particles have adhered to the surface of the metal mask prepared as above. Accordingly, it is good for the prepared metal mask to be washed. As the washing method, ultrasonic washing is preferable. It is preferable to use an organic solvent as the washing solution.

In the present embodiment, a thickness t of the metal mask 60 shown in FIG. 4B is preferably 200 µm or less. The thickness t is more preferably 150 µm or less and even more preferably 100 µm or less. If the thickness t of the metal mask 60 exceeds 200 µm, a degree of film formation defectiveness caused in the corner portion of the opening portion 62 may increase, whereby the performance of the photoelectric conversion layer may deteriorate.

In order to maintain rigidity of the metal mask, the thickness t thereof is preferably 40 µm or more, more preferably 45 µm or more, and even more preferably 50 µm or more. Further, in order to maintain rigidity of the metal mask, it is preferable for the mask to be welded to a frame of metal such as SUS.

In the metal mask 60, a depth h of half etching shown in FIG. 4B is preferably 5 µm or more.

The depth h of half etching is a distance between the rear surface 60b of the metal mask 60 and a lower surface 65 of the half etching portion 64.

The depth h of half etching is more preferably 10 µm or more and equal to or less than half of the minimum thickness of the metal mask 60, and even more preferably 15 µm or more and equal to or less than half of the minimum thickness of the metal mask 60.

If the depth h of half etching is less than 5 µm, the effect of suppressing adherence of dust is diminished. In order to maintain rigidity of the metal mask 60, it is preferable to control the depth h of half etching to be equal to or less than half of the thickness of the metal mask 60.

In the metal mask 60, a maximum length d of the half etching portion 64 shown in FIG. 4B is the longest distance among distances from the rim of the opening portion 62 to the edge surface 67 of the non-half etching portion 66 of the metal mask 60.

The maximum length d of the half etching portion 64 is preferably 1,200 µm or less, more preferably 900 µm or less, and even more preferably 600 µm or less.

If the maximum length d of the half etching portion 64 exceeds 900 µm, the outer rim of the opening portion 62 of the metal mask 60 may bend due to the magnetic force of the magnet sheet 70 which is for mounting the metal mask 60 to the substrate, and this may cause dust to adhere to the metal mask.

Meanwhile, considering positional aberration of the metal mask and the substrate that is caused by thermal expansion or the like, the maximum length d of the half etching portion 64 is preferably 20 µm or more, more preferably 30 µm or more, and even more preferably 50 µm or more.

The length of the half etching portion 64 in the longitudinal direction of the opening portion 62 may be different from the length in the transverse direction of the opening portion 62 in some cases. In this case, among the lengths in the longitudinal and transverse directions of the opening portion 62, the maximum length is the maximum length d of the half etching portion 64.

As the material of the metal mask, it is preferable to use materials which are adsorbed onto a magnet and have a small coefficient of linear expansion. A coefficient of thermal expansion thereof is preferably $20 \times 10^{-6}$ (1/K) or less, more preferably $10 \times 10^{-6}$ (1/K) or less, and even more preferably $5 \times 10^{-6}$ (1/K) or less. Examples of the material which are adsorbed onto a magnet and have a small coefficient of thermal expansion include an invar material (Fe/Ni alloy) and the like.

Figure 6A:
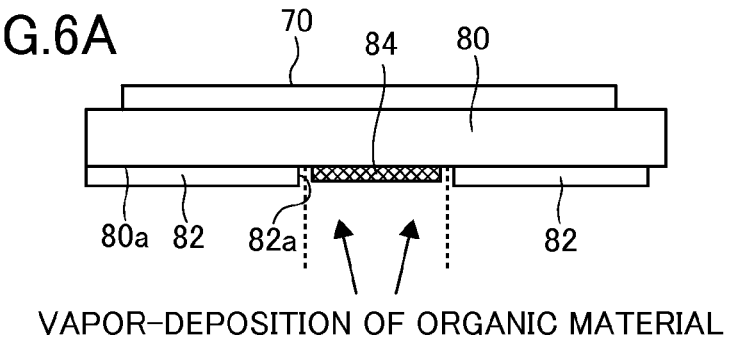
FIG. 6A is a schematic view for describing an experiment method used for experiment for examining whether dust is generated due to a metal mask.

As shown in FIG. 6A, a metal mask 82 having an opening portion 82a was caused to come into close contact with a wafer 80 by using the magnet sheet 70, and an organic film 84 was formed on the wafer 80 by vapor deposition. The metal mask 82 had not undergone half etching.

Figure 6B:
FIG. 6B is a dark-field image showing a state of a wafer where an organic film has not yet been formed using a metal mask.

As shown in FIG. 6B, before the metal mask 82 was mounted on the wafer, a state where dust had not adhered to a surface 80a of the wafer 80 was confirmed from a dark-field image obtained by an optical microscope.

Figure 7A:
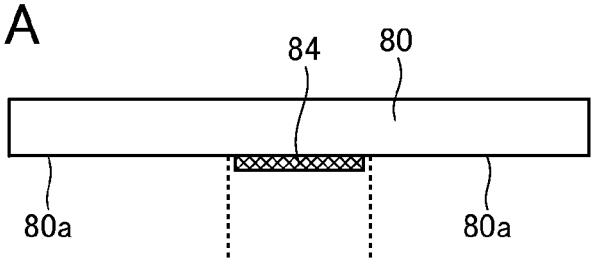
FIG. 7A is a schematic view showing a state where the organic film has been formed using a metal mask.
Figure 7B:
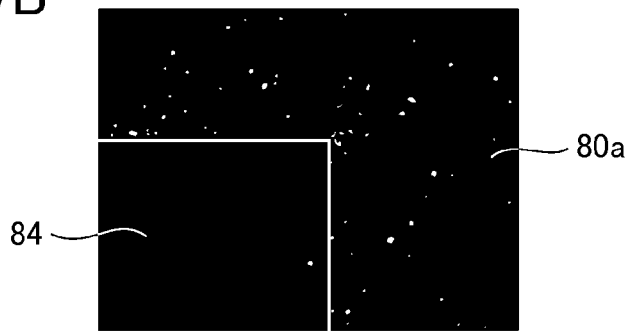
FIG. 7B is a dark-field image showing a state of the wafer from which the metal mask has been removed after the organic film was formed on the wafer.

As shown in FIG. 7A, after the organic film 84 was formed, the metal mask 82 was removed, and the surface 80a of the wafer 80 was observed by using a dark-field image obtained by an optical microscope. As a result, it was found that, as shown in FIG. 7B, a large amount of dust adhered to the portion where the metal mask 82 came into contact with the wafer 80. This shows that a large amount of dust adheres to the wafer if a metal mask not subjected to half etching is used.

Figure 8:
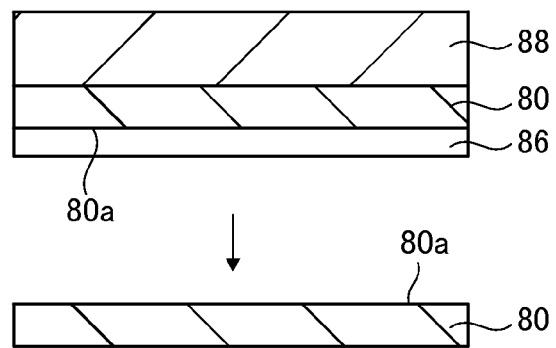
FIG. 8 is a schematic view for describing another experiment method used for experiment for examining whether dust is generated due to a metal mask having undergone half etching.

Moreover, as shown in FIG. 8, the metal mask 86 having the half etching portion was caused to come into close contact with the surface 80a of the wafer 80 by using a magnet sheet 88. Thereafter, the metal mask 86 was removed, and the surface 80a of the wafer 80 was observed to see the state of dust having adhered to the wafer.

The thickness of the metal mask 86 is 50 µm, and the depth h of half etching thereof is 25 µm. As the metal mask 86, a metal mask in which the half etching portion had a length of 1.635 mm in the longitudinal direction and a length of 2.05 mm in the transverse direction, and a metal mask in which the half etching portion had a length of 1.2 mm in both the longitudinal and transverse directions were used.

Figure 9A:
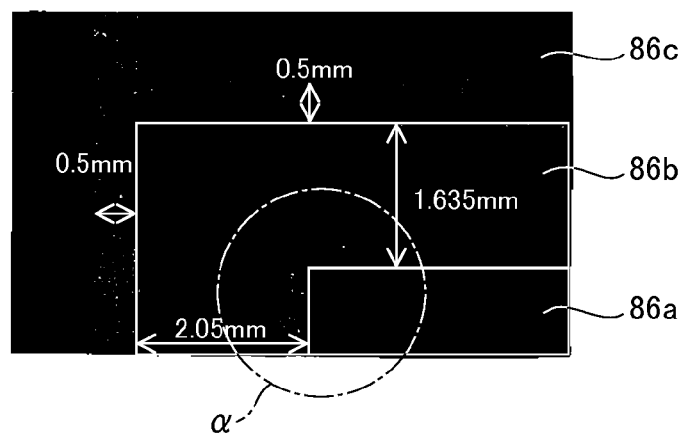
FIG. 9A is a dark-field image showing a state of a wafer from which the metal mask having undergone half etching has been removed after an organic film was formed on the wafer.
Figure 9B:
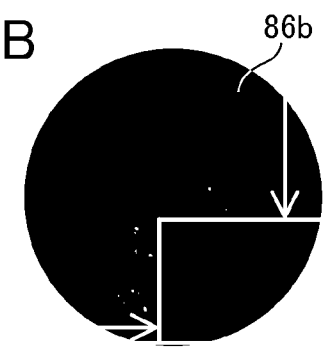
FIG. 9B is a view obtained by enlarging the main part of FIG. 9A.

As shown in FIGS. 9A and 9B, in the metal mask in which the half etching portion had a length of 1.635 mm in the longitudinal direction and a length of 2.05 mm in the transverse direction, adherence of dust to the opening portion 86a of the metal mask 86 was not observed. However, it was found that dust adhered to a half etching portion 86b of the metal mask 86 and to a non-half etching portion 86c.

Figure 9C:
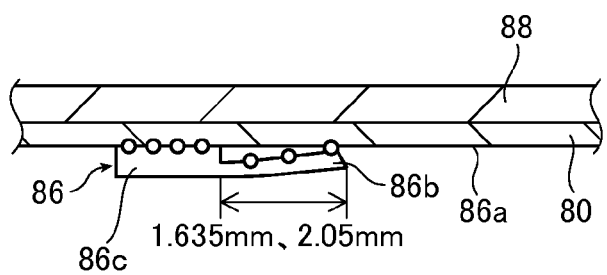
FIG. 9C is a schematic view showing a state where the metal mask having undergone half etching has been mounted on the wafer.

It is considered that this is because the half etching portion 86b bent toward the surface 80a of the wafer 80 as shown in FIG. 9C, hence adherence of dust occurred.

Figure 10A:
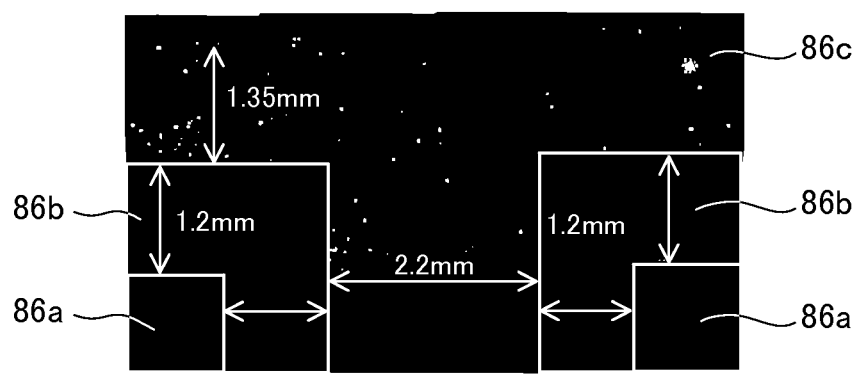
FIG. 10A is a dark-field image showing a state of a wafer from which the metal mask having undergone half etching has removed after an organic film was formed on the wafer.

On the contrary, as shown in FIG. 10A, in the metal mask in which the half etching portion had a length of 1.2 mm in both the longitudinal and transverse directions, adherence of dust to the opening portion 86a of the metal mask 86 was not observed. Moreover, adherence of dust to the half etching portion 86b of the metal mask 86 was also not observed. Moreover, although adherence of dust to the non-half etching portion 86c was observed, the amount of dust having adhered thereto is smaller than that of the dust having adhered to the metal mask in which the half etching portion had a length of 1.635 mm in the longitudinal direction and a length of 2.05 mm in the transverse direction.

Figure 10B:
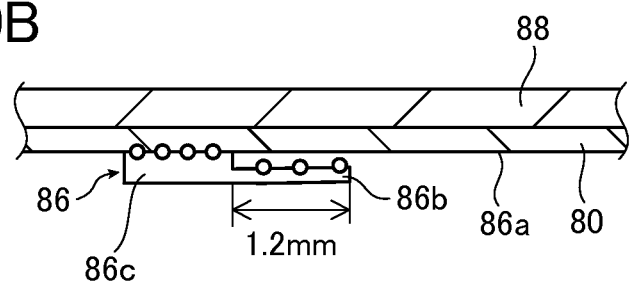
FIG. 10B is a schematic view showing a state where the metal mask having undergone half etching has been mounted on the wafer.

It is considered that this is because the half etching portion 86b did not bend toward the surface 80a of the wafer 80 as shown in FIG. 10B, hence adherence of dust did not occur.

The above results show that in order to suppress adherence of dust, it is preferable to shorten the length of the half etching portion. The results also show that when the thickness of the half etching portion is 25 µm, it is preferable to control the maximum length d of the half etching portion to be 1.2 mm or less.

In the present invention, as described above, the maximum length d of the half etching portion 64 is preferably 1,200 µm or less.

In the production method of the present embodiment, for holding and transporting the substrate 12, the solid-state imaging device which is being in the process of production, and the metal mask 60, it is preferable to use a mechanism made of a nonmagnetic material. If such a mechanism is used, it is possible to suppress the generation of fine magnetic particles and to inhibit the fine magnetic particles from adhering to the surface 50a of the photoelectric conversion layer 50 to be formed.

In the production apparatus used for vapor-depositing organic materials, the organic materials are vapor-deposited not only to the substrate but also to the inner wall and the like of the apparatus. As the thickness of the film vapor-deposited to the inner wall and the like increases, the vapor-deposited film is peeled off, and this leads to a problem that the peeled film adheres to the surface 50a of the photoelectric conversion layer 50. Therefore, it is preferable to perform surface processing such as blast processing on the portions, such as the inner wall and the like, which are other than the substrate and to which the organic materials are vapor-deposited, such that concavities and convexities are formed on the surface thereof. If the surface processing is performed, it is possible to inhibit the film from peeling off the inner wall and the like and to inhibit the peeled film from adhering to the surface 50a of the photoelectric conversion layer 50.

Regarding the washing method performed after the use of the metal mask, in principle, the washing method is required to enable the organic vapor-deposition materials to be eluted from the metal such as an invar material (Fe/Ni alloy). Accordingly, it is preferable to use an organic solvent, and from the viewpoint of safety, it is preferable to select organic solvents having a flashing point as high as possible. Examples of such organic solvents include OEL Clean Series 03 manufactured by KANTO CHEMICAL CO., INC., that is a water-soluble liquid (flashing point of 95° C.) of the third petroleum of class 4 dangerous goods. Specifically, for example, the organic film formed by deposition and having a thickness of about 10 µm is washed for about 5 minutes (at a liquid temperature of 40° C. with US).

Next, the photoelectric conversion layer 50 and the electron blocking layer 52 constituting the photoelectric conversion portion 18 will be described in more detail.

The photoelectric conversion layer 50 is constituted in the same manner as the aforementioned photoelectric conversion layer 112. The photoelectric conversion layer 50 contains a p-type organic semiconductor material and an n-type organic semiconductor material. By joining the p-type organic semiconductor material with the n-type organic semiconductor material to form a donor-acceptor interface, exciton dissociation efficiency can be increased. Therefore, the photoelectric conversion layer having a constitution in which the p-type organic semiconductor material is joined with the n-type organic semiconductor material realizes high photoelectric conversion efficiency. Particularly, the photoelectric conversion layer in which the p-type organic semiconductor material is mixed with the n-type organic semiconductor material is preferable since the junction interface is enlarged, and the photoelectric conversion efficiency is improved.

The p-type organic semiconductor material (compound) is a donor-type organic semiconductor material (compound). This material is mainly represented by a hole-transporting organic compound and refers to an organic compound that easily donates electrons. More specifically, when two organic materials are used by being brought into contact to each other, an organic compound having a smaller ionization potential is called the p-type organic semiconductor material. Accordingly, as the donor-type organic compound, any organic compounds can be used as long as they have electron-donating properties. For example, it is possible to use a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, condensed aromatic carbon ring compounds (naphthalene derivatives, anthracene derivatives, phenanthrene derivatives, tetracene derivatives, pyrene derivatives, perylene derivatives, and fluoranthene derivatives), metal complexes having nitrogen-containing heterocyclic compounds as ligands, and the like. The donor-type organic compound is not limited to these, and as described above, any of organic compounds having a smaller ionization potential compared to organic compounds used as n-type (acceptor-type) compounds may be used as the donor-type organic compound.

The n-type organic semiconductor material (compound) is an acceptor-type organic semiconductor material. This material is mainly represented by an electron-transporting organic compound and refers to an organic compound that easily accepts electrons. More specifically, when two organic compounds are used by being brought into contact to each other, an organic compound showing a higher degree of electron affinity is called the n-type organic semiconductor material. Accordingly, as the acceptor-type organic compound, any organic compounds can be used as long as they have electron-accepting properties. For example, it is possible to use condensed aromatic carbon ring compounds (naphthalene derivatives, anthracene derivatives, phenanthrene derivatives, tetracene derivatives, pyrene derivatives, perylene derivatives, and fluoranthene derivatives), 5 to 7-membered heterocyclic compounds containing nitrogen atoms, oxygen atoms, or sulphur atoms (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, and tribenzazepine), a polyarylene compound, a fluorene compound, a cyclopentadiene compound, a silyl compound, metal complexes having nitrogen-containing heterocyclic compounds as ligands, and the like. The acceptor-type organic compound is not limited to these, and as described above, any of organic compounds showing a higher degree of electron affinity compared to organic compounds used as p-type (donor-type) compounds may be used as the acceptor-type organic compound.

As the p-type organic semiconductor material or the n-type organic semiconductor material, any organic dye may be used. However, preferable examples thereof include cyanine dyes, styryl dyes, hemicyanine dyes, merocyanine dyes (including zero-methine merocyanine (simple merocyanine)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethane dyes, spiro compounds, metallocene dyes, fluorenone dyes, fulgide dyes, perylene dyes, perinone dyes, phenazine dyes, phenothiazine dyes, quinone dyes, diphenylmethane dyes, polyene dyes, acridine dyes, acridinone dyes, diphenylamine dyes, quinacridone dyes, quinophthalone dyes, phenoxazine dyes, phthaloperylene dyes, diketopyrrolopyrrole dyes, dioxane dyes, porphyrin dyes, chlorophyll dyes, phthalocyanine dyes, metal complex dyes, and condensed aromatic carbon ring-based dyes (naphthalene derivatives, anthracene derivatives, phenanthrene derivatives, tetracene derivatives, pyrene derivatives, perylene derivatives, and fluoranthene derivatives).

As the n-type organic semiconductor material, it is particularly preferable to use fullerene or fullerene derivatives having excellent electron transport properties. Fullerene refers to fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, mixed fullerene, or fullerene nanotubes, and fullerene derivatives refer to compounds obtained when a substituent is added to the fullerene.

As the substituent of the fullerene derivatives, alkyl groups, aryl groups, or heterocyclic groups are preferable. As the alkyl groups, alkyl groups having 1 to 12 carbon atoms are more preferable. As the aryl and heterocyclic groups, benzene rings, naphthalene rings, anthracene rings, phenanthrene rings, fluorene rings, triphenylene rings, naphthacene rings, biphenyl rings, pyrrole rings, furan rings, thiophene rings, imidazole rings, oxazole rings, thiazole rings, pyridine rings, pyrazine rings, pyrimidine rings, pyridazine rings, indolizine rings, indole rings, benzofuran rings, benzothiophene rings, isobenzofuran rings, benzimidazole rings, imidazopyridine rings, quinolizine rings, quinoline rings, phthalazine rings, naphthyridine rings, quinoxaline rings, quinoxazoline rings, isoquinoline rings, carbazole rings, phenanthridine rings, acridine rings, phenanthroline rings, thianthrene rings, chromene rings, xanthene rings, phenoxathiin rings, phenothiazine rings, or phenazine rings are preferable; benzene rings, naphthalene rings, anthracene rings, phenanthrene rings, pyridine rings, imidazole rings, oxazole rings, or thiazole rings are more preferable; and benzene rings, naphthalene rings, or pyridine rings are particularly preferable. These may further contain a substituent, and the substituent may bind to form a ring as much as possible. Moreover, the above substituents may have plural substituents which may be the same as or different from each other. The plural substituents may bind to form a ring as much as possible.

If the photoelectric conversion layer 50 contains fullerene or fullerene derivatives, electrons generated by photoelectric conversion can be rapidly transported to the pixel electrodes 16 or the counter electrode 20 via fullerene molecules or fullerene derivative molecules. If the fullerene molecules or fullerene derivative molecules line up and form the pathway of electrons in this state, electron transport properties are improved, whereby high-speed responsiveness of the photoelectric conversion element can be realized. In order to achieve the above improvement, it is preferable for the photoelectric conversion layer to contain fullerene or fullerene derivatives in a proportion of 40% (volumetric proportion) or more. However, if the proportion of fullerene or fullerene derivatives is too high, the proportion of the p-type organic semiconductor is reduced, and the junction interface becomes small, whereby the exciton dissociation efficiency is reduced.

For the photoelectric conversion layer 50, it is particularly preferable to use triarylamine compounds, which are disclosed in JP 4213832 B and the like, as the p-type organic semiconductor material mixed with fullerene or fullerene derivatives, since a high SN ratio of the photoelectric conversion element can be realized. If the proportion of fullerene or fullerene derivatives in the photoelectric conversion layer is too high, the proportion of the triarylamine compounds is reduced, and the amount of absorbed incident light decreases. Since the photoelectric conversion efficiency is reduced for this reason, it is preferable for the proportion of fullerene or fullerene derivatives contained in the photoelectric conversion layer to be 85% (volumetric proportion) or less.

Electron-donating organic materials can be used for the electron blocking layer 52. Specifically, as low-molecular weight materials, it is possible to use aromatic diamine compounds such as N,N-bis(3-methylphenyl)-(1,1'-biphenyl)-4,4'-diamine (TPD) or 4,4'-bis[N-(naphthyl)-N-phenylamino]biphenyl ($\alpha$-NPD), oxazole, oxadiazole, triazole, imidazole, imidazolone, stilbene derivatives, pyrazoline derivatives, tetrahydroimidazole, polyarylalkane, butadiene, 4,4',4''-tris(N-(3-methylphenyl)N-phenylamino)triphenylamine (m-MTDATA), porphyrin compounds such as porphine, tetraphenylporphyrin copper, phthalocyanine, copper phthalocyanine, and titanium phthalocyanine oxide, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, silazane derivatives, and the like. As high-molecular weight materials, it is possible to use polymers such as phenylene vinylene, fluorene, carbazole, indole, pyrene, pyrrole, picoline, thiophene, acetylene, and diacetylene and derivatives of these. The compounds that are not electron-donating compounds can also be used as long as they have sufficient hole transport properties.

As the electron blocking layer 52, inorganic materials can also be used. Generally, inorganic materials have a higher dielectric constant compared to organic materials. Accordingly, when inorganic materials are used for the electron blocking layer 52, higher voltage is applied to the photoelectric conversion layer, hence the photoelectric conversion efficiency can be improved. Examples of inorganic materials that can form the electron blocking layer 52 include calcium oxide, chromium oxide, copper-chromium oxide, manganese oxide, cobalt oxide, nickel oxide, copper oxide, copper-gallium oxide, copper-strontium oxide, niobium oxide, molybdenum oxide, copper-indium oxide, silver-indium oxide, and iridium oxide.

In the electron blocking layer consisting of plural layers, it is preferable that among the plural layers, the layer adjacent to the photoelectric conversion layer 50 be a layer which is made of the same material as the p-type organic semiconductor contained in the photoelectric conversion layer 50. In this manner, if the p-type organic semiconductor is also used for the electron blocking layer 52, it is possible to inhibit an intermediate level from being formed in the interface between the photoelectric conversion layer 50 and the layer adjacent thereto, and to further suppress dark currents.

When the electron blocking layer 52 consists of a single layer, the layer can be formed of an inorganic material. Alternatively, when the electron blocking layer 52 consists of plural layers, one, two, or more layers can be formed of an inorganic material.

The present invention is basically configured as above. So far, the method for producing a solid-state imaging device according to the present invention has been described in detail. However, the present invention is not limited to the above embodiments. Needless to say, the present invention may be improved or modified in various ways, within a range that does not depart from the gist of the present invention.

EXAMPLES

Hereinafter, the effects of the present invention will be described in detail.

In the present examples, the following Examples 1 to 9 were prepared to confirm whether or not film blistering occurs. The results are shown in the following Table 1. In the column of Evaluation in the following Table 1, examples in which film blistering did not occurred were marked with "GOOD", and examples in which film blistering occurred were marked with "NOT GOOD".

Examples 1 to 9 are respectively configured with a substrate, an organic layer (an electron blocking layer and a photoelectric conversion layer), a sealing layer, color filters, and an overcoat layer disposed on one another in this order.

As the substrate, a Si substrate on which a CMOS readout circuit, a wiring layer, an insulating layer, and pixel electrodes have been prepared by standard CMOS image sensor process was used. The pixel electrodes were formed of TiN (film thickness of 15 nm) by a CVD method. Moreover, TiN was subjected to dry etching process under conditions of isotropic plasma etching, whereby patterning was performed such that a slope was formed at each edge of the pixel electrodes.

The organic layer (an electron blocking layer and a photoelectric conversion layer) was formed by using a metal mask. The metal mask was caused to come into close contact with the substrate by using a magnet sheet. The thickness of the metal mask was set to 50 μm.

The electron blocking layer composing the organic layer was formed of a compound represented by the following Formula (1). The compound represented by Formula (1) was vapor-deposited to form the electron blocking layer having a thickness of 100 nm.

Regarding the photoelectric conversion layer composing the organic layer, a compound represented by the following Formula (2) was vapor-deposited on the electron blocking layer together with fullerene $C_{60}$ such that a compositional proportion of fullerene $C_{60}$ became 80%, whereby a photoelectric conversion layer having a thickness of 400 nm was formed.

The inner wall of the apparatus performing vapor deposition of the organic layer was subjected to blast processing to inhibit the film from peeling off the inner wall of the apparatus.

As a counter electrode, an ITO film having a thickness of 10 nm was formed on the organic layer by subjecting an ITO target to high-frequency magnetron sputtering in an atmosphere into which Ar gas and $O_2$ gas have been introduced and had a degree of vacuum of 0.1 Pa.

As the sealing layer, the following two-layer laminate film was used. First, trimethylaluminum and water were put in an atomic layer deposition apparatus to form an aluminum oxide film having a thickness of 0.2 μm on the counter electrode at a substrate temperature of 150° C. or lower in an atmosphere having a degree of vacuum of 0.5 kPa that used Ar as carrier gas. On the aluminum oxide film, a silicon nitride oxide film having a film thickness of 0.1 μm was formed by high-frequency magnetron sputtering in an atmosphere having a degree of vacuum of 0.1 Pa.

The color filters were formed on the sealing layer by a photolithography method, and on these color filters, the overcoat layer was formed.

Formula (1)

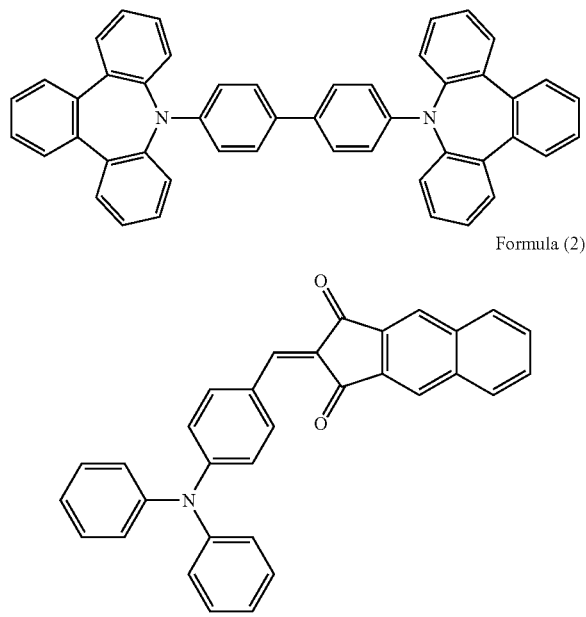

Formula (2)

TABLE 1

|  | Depth of half etching (μm) | Length of half etching (μm) | Evaluation |
|---|---|---|---|
| Example 1 | 5 | 900 | Good |
| Example 2 | 25 | 900 | Good |
| Example 3 | 25 | 20 | Good |
| Example 4 | 25 | 1200 | Good |
| Example 5 | — | — | NOT GOOD |
| Example 6 | 3 | 900 | NOT GOOD |
| Example 7 | 40 | 900 | NOT GOOD |
| Example 8 | 25 | 5 | NOT GOOD |
| Example 9 | 25 | 1500 | NOT GOOD |

In Example 1, when the electron blocking layer and the photoelectric conversion layer were vapor-deposited using a metal mask for which the depth and length of half etching were set to 5 μm and 900 μm respectively, film blistering did not occur.

In Example 2, when the electron blocking layer and the photoelectric conversion layer were vapor-deposited using a metal mask for which the depth and length of half etching were set to 25 μm and 900 μm respectively, film blistering did not occur.

In Example 3, when the electron blocking layer and the photoelectric conversion layer were vapor-deposited using a metal mask for which the depth and length of half etching were set to 25 μm and 20 μm respectively, film blistering did not occur.

In Example 4, when the electron blocking layer and the photoelectric conversion layer were vapor-deposited using a metal mask for which the depth and length of half etching were set to 25 μm and 1,200 μm respectively, film blistering did not occur.

In Example 5, when the electron blocking layer and the photoelectric conversion layer were vapor-deposited using a metal mask having not undergone half etching, film blistering occurred at 5% of the site where the organic film was formed. It is considered that particles might have been transferred to the edge of the organic film from the metal mask, and the organic solvent used in the photolithography process might have entered the film by using the site, to which the particles were transferred, as a starting point.

In Example 6, when the electron blocking layer and the photoelectric conversion layer were vapor-deposited using a metal mask for which the depth and length of half etching were set to 3 μm and 900 μm respectively, film blistering occurred at 1% of the site where the organic film was formed. It is considered that in this case, the etching depth might have been insufficient, and similarly to the above, the organic solvent used in the photolithography process might have entered the film by using the site, to which the particles were transferred, as a starting point.

In Example 7, when the electron blocking layer and the photoelectric conversion layer were vapor-deposited using a metal mask for which the depth and length of half etching were set to 40 μm and 900 μm respectively, film blistering occurred at 1% of the site where the organic film was formed. It is considered that in this case, the half etching portion might have bent significantly due to magnetic force, particles might have been transferred to the edge of the organic film from the mask, and the organic solvent used in the photolithography process might have entered the film by using the site, to which the particles were transferred, as a starting point.

In Example 8, when the electron blocking layer and the photoelectric conversion layer were vapor-deposited using a metal mask for which the depth and length of half etching were set to 25 μm and 5 μm respectively, film blistering occurred at 3% of the site where the organic film was formed. It is considered that in this case, since positional aberration occurred between the substrate and the mask due to the influence of thermal expansion and the like, particles might have been transferred to the edge of the organic film from the non-half etching portion of the metal mask, and the organic solvent used in the photolithography process might have entered the film by using the site, to which the particles were transferred, as a starting point.

In Example 9, when the electron blocking layer and the photoelectric conversion layer were vapor-deposited using a metal mask for which the depth and length of half etching were set to 25 μm and 1,500 μm respectively, film blistering occurred at 1% of the site where the organic film was formed. It is considered that in this case, the half etching portion might have bent significantly due to magnetic force, particles might have been transferred to the edge of the organic film form the mask, and the organic solvent used in the photolithography process might have entered the film by using the site, to which the particles were transferred, as a starting point.

What is claimed is:
1. A method for producing a solid-state imaging device in which pixel electrodes, a photoelectric conversion portion that has an organic film generating electric charge in response to incident light, a transparent counter electrode, and a sealing layer are formed on a substrate, the method comprising the steps of:
   causing a metal mask to come into close contact with a substrate surface, on which the pixel electrodes are disposed, by magnetic force;
   forming the organic film by vapor-depositing an organic substance to the substrate surface on which the pixel electrodes are disposed;
   removing the metal mask after the organic film is formed;
   forming the counter electrode on the organic film; and
   forming the sealing layer covering the counter electrode,
   wherein the metal mask has undergone half etching to have a half etching portion and comes into close contact with the substrate surface such that a lower surface of the half etching portion faces the pixel electrodes.

2. The method for producing a solid-state imaging device according to claim 1,
wherein a thickness of the metal mask is 40 µm to 200 µm, and the half etching portion is formed by half etching the metal mask in a length of 20 µm to 1,200 µm and to a depth of from 5 µm to a value equal to or less than half of the thickness of the metal mask.

3. The method for producing a solid-state imaging device according to claim 1,
wherein the substrate and the metal mask are held and transported by a mechanism fully made of a nonmagnetic material.

4. The method for producing a solid-state imaging device according to claim 2,
wherein the substrate and the metal mask are held and transported by a mechanism fully made of a nonmagnetic material.

5. The method for producing a solid-state imaging device according to claim 1,
wherein the metal mask is caused to come into close contact with the substrate surface by a magnet sheet.

6. The method for producing a solid-state imaging device according to claim 2,
wherein the metal mask is caused to come into close contact with the substrate surface by a magnet sheet.

7. The method for producing a solid-state imaging device according to claim 3,
wherein the metal mask is caused to come into close contact with the substrate surface by a magnet sheet.

8. The method for producing a solid-state imaging device according to claim 1,
wherein the metal mask is caused to come into close contact with the substrate surface by a flat plate paved with magnets.

9. The method for producing a solid-state imaging device according to claim 2,
wherein the metal mask is caused to come into close contact with the substrate surface by a flat plate paved with magnets.

10. The method for producing a solid-state imaging device according to claim 3,
wherein the metal mask is caused to come into close contact with the substrate surface by a flat plate paved with magnets.

11. The method for producing a solid-state imaging device according to claim 8,
wherein by adjusting a distance between the flat plate paved with magnets and the metal mask, magnetic force applied to the metal mask is adjusted to a predetermined level.

12. The method for producing a solid-state imaging device according to claim 9,
wherein by adjusting a distance between the flat plate paved with magnets and the metal mask, magnetic force applied to the metal mask is adjusted to a predetermined level.

13. The method for producing a solid-state imaging device according to claim 10,
wherein by adjusting a distance between the flat plate paved with magnets and the metal mask, magnetic force applied to the metal mask is adjusted to a predetermined level.

14. The method for producing a solid-state imaging device according to claim 11,
wherein the magnetic force applied to the metal mask is adjusted so as to be equivalent to magnetic force obtained when a magnet sheet is used.

15. The method for producing a solid-state imaging device according to claim 12,
wherein the magnetic force applied to the metal mask is adjusted so as to be equivalent to magnetic force obtained when a magnet sheet is used.

16. The method for producing a solid-state imaging device according to claim 13,
wherein the magnetic force applied to the metal mask is adjusted so as to be equivalent to magnetic force obtained when a magnet sheet is used.

* * * * *